United States Patent
Yang et al.

(10) Patent No.: US 9,279,081 B2
(45) Date of Patent: Mar. 8, 2016

(54) PHOSPHOR COMPOSITION AND WHITE LIGHT EMITTING DEVICE USING THE SAME

(75) Inventors: Yao-Yu Yang, New Taipei (TW); Yu-Huan Liu, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 0 days.

(21) Appl. No.: 13/553,818

(22) Filed: Jul. 20, 2012

(65) Prior Publication Data

US 2013/0033167 A1 Feb. 7, 2013

(30) Foreign Application Priority Data

Aug. 2, 2011 (TW) .............................. 100127429 A

(51) Int. Cl.
*H01L 33/50* (2010.01)
*C09K 11/79* (2006.01)
*C09K 11/64* (2006.01)
*C09K 11/77* (2006.01)
*C09K 11/08* (2006.01)

(52) U.S. Cl.
CPC ......... *C09K 11/7774* (2013.01); *C09K 11/0883* (2013.01); *C09K 11/7734* (2013.01); *H01L 33/504* (2013.01); *Y02B 20/181* (2013.01)

(58) Field of Classification Search
CPC ........... C09K 11/0883; C09K 11/7734; C09K 11/7774; H01L 33/504
USPC .......................................... 313/501, 503, 498
See application file for complete search history.

(56) References Cited

U.S. PATENT DOCUMENTS

| 7,253,446 | B2 | 8/2007 | Sakuma et al. |
| 2003/0094893 | A1 | 5/2003 | Ellens et al. |
| 2006/0186377 | A1 | 8/2006 | Takahashi et al. |
| 2006/0208262 | A1 | 9/2006 | Sakuma et al. |
| 2007/0164308 | A1 | 7/2007 | Yoshimura et al. |
| 2008/0272688 | A1 | 11/2008 | Yoshimura |
| 2009/0194781 | A1 | 8/2009 | Harada |
| 2011/0031874 | A1 | 2/2011 | Hosokawa et al. |

FOREIGN PATENT DOCUMENTS

| CN | 101785120 | 7/2010 |
| JP | 2006261512 | 9/2006 |
| JP | WO2011024818 | 3/2011 |
| TW | 200635087 | 10/2006 |

OTHER PUBLICATIONS

English machine translation of JP 2007-116117 (Kawashima et al).*
Naoto Kijima et al., A new yellow phosphor La3SibN11Ce3+ for white LEDs, 21th ECS meeting, Abstract #3231, The Electrochemical Society.

(Continued)

*Primary Examiner* — Sikha Roy
(74) *Attorney, Agent, or Firm* — Han IP Corporation

(57) ABSTRACT

A phosphor composition and a white light emitting device using the same are disclosed. The white light emitting device includes a blue light emitting diode and a phosphor composition disposed on the blue light emitting diode, wherein the phosphor composition includes a yellow lanthanum silicon nitride, a yellow β-SiAlON and a red CaAlSiN, and the weight proportion of the yellow lanthanum silicon nitride, the yellow β-SiAlON and the red CaAlSiN is 1: 1:0.3~0.45.

18 Claims, 4 Drawing Sheets

(56) References Cited

OTHER PUBLICATIONS

T. Seto et al., A New Yellow Phosphor La3SibN11:Ce3+ for White LEDs, ECS Transactions, Electrochemical Society, 2009.

European Patent Office, Partial European Search Report for Application No. 12177890.6, Jul. 17, 2014.
European Patent Office, Office Communication dated Aug. 5, 2015, p. 3.

* cited by examiner

PHOSPHOR COMPOSITION AND WHITE LIGHT EMITTING DEVICE USING THE SAME

CROSS-REFERENCE TO RELATED APPLICATION

This application claims the priority benefit of Taiwan Patent Application No. 100127429, filed on Aug. 2, 2011. The entirety of the above-identified patent application is hereby incorporated by reference.

BACKGROUND

1. Technical Field

The present invention relates to a phosphor composition and a white light emitting device using the phosphor composition. More particularly, the present invention relates to a phosphor composition and a white light emitting device using the phosphor composition to provide better light type, thermal stability and no power saturation.

2. Description of Related Art

With rising awareness of carbon reduction and sustainable development, advanced countries around the world are gradually phasing out traditional high energy-consuming lighting with white light emitting diodes (LEDs) as replacement. White LEDs advantageously have small size and thus can be adjusted depending on the application. Given the fast response time, white LEDs are suitable for high frequency operation. White LEDs have low power consumption, which is about ⅛ to 1/10 of that of traditional bulbs and ½ of that of fluorescent bulbs. Moreover, white LEDs have relatively long life of up to 100,000 hours. Accordingly, white LEDs can be a solution to the problem of high energy consumption by incandescent bulbs. Thus, white LEDs can be used as a new lighting and display light source, and promote the concepts of energy saving and environmental protection. They are considered as a "green" light source.

The technology related to white LEDs was introduced in the 1990s. Basically, cerium-doped yttrium aluminum garnet phosphor (Ce-doped YAG phosphor) is excited by blue LED to produce yellow light. The yellow light is mixed with remaining blue light emitted by the blue LED to produce white light. However, yttrium aluminum garnet phosphor, as used in white light technology, tends to have the problem of power saturation; namely, any increase in brightness is limited after the brightness of the yellow light produced by excitation of yttrium aluminum garnet phosphor has reached a certain level.

Since the year 2000, white LEDs based on yellow silicate phosphor has become an alternative white light technology. Nevertheless, although silicate phosphor does not have power saturation problem, it tends to suffer the problem of thermal stability. That is, after being exposed to an environment of intense heat for a long time, the brightness of the yellow light produced by silicate phosphor tends to decay gradually. This will result in reduction of brightness of white light and color temperature shift, in addition to the susceptibility to damp and breakdown. Therefore, it is imperative to develop a new phosphor composition that avoids the aforementioned problems.

SUMMARY

The present invention provides a phosphor composition as well as a white light emitting device using such phosphor composition to address the aforementioned problems and provide a light source of high-quality white light.

According to one aspect, a white light emitting device that emits a white light may comprise an LED, having an emission wavelength in a range of 440 nm-470 nm, and a phosphor composition disposed on the blue light LED. The phosphor composition may comprise: a first yellow phosphor having a peak wavelength in a range of 535 nm-545 nm, a second yellow phosphor having a peak wavelength in a range of 545 nm-555 nm, and a red phosphor having a peak wavelength in a range of 645 nm-655 nm. A range of chromaticity coordinates of the white light may be CIE x: 0.25-0.3 and CIE y: 0.22-0.28.

In one embodiment, a weight proportion of the first yellow phosphor, the second yellow phosphor, and the red phosphor may be 1:1:0.3~0.45.

In one embodiment, a proportion of the red phosphor may be 0.4.

In one embodiment, the first yellow phosphor may comprise lanthanum silicon nitride.

In one embodiment, the first yellow phosphor may comprise $La_3Si_5N_{11}:Ce^{2+}$.

In one embodiment, the second yellow phosphor may comprise β-SiAlON.

In one embodiment, the second yellow phosphor may comprise $Si_{6-z}Al_zN_zO_{8-z}:Eu^{2+}$, where $0<z<4.2$.

In one embodiment, the red phosphor may comprise calcium aluminosilicate nitride (CaAlSiN).

In one embodiment, the red phosphor may comprise $CaAlSiN_3:Eu^{2+}$.

In one embodiment, the LED may have a peak wavelength in a range of 450 nm-460 nm.

According to another aspect, a white light emitting device may comprise a blue LED and a phosphor composition disposed on the blue LED. The phosphor composition may comprise a yellow lanthanum silicon nitride, a yellow β-SiAlON, and a red calcium aluminosilicate nitride (CaAlSiN). A weight proportion of the yellow lanthanum silicon nitride, the yellow β-SiAlON, and the red CaAlSiN may be 1:1:0.3~0.45.

In one embodiment, a proportion of the red CaAlSiN may be 0.4.

In one embodiment, yellow lanthanum silicon nitride may comprise $La_3Si_5N_{11}:Ce^{2+}$.

In one embodiment, the yellow β-SiAlON may comprise $Si_{6-z}Al_zN_zO_{8-z}:Eu^{2+}$, where $0<z<4.2$.

In one embodiment, the red CaAlSiN may comprise $CaAlSiN_3:Eu^{2+}$.

According to another aspect, a white light emitting device may comprise a blue LED and a phosphor composition disposed on the blue LED. The phosphor composition may comprise a first nitride phosphor, a second nitride phosphor, and a third nitride phosphor. A peak wavelength of the second nitride phosphor may be between a peak wavelength of the first nitride phosphor and a peak wavelength of the third nitride phosphor.

In one embodiment, the first nitride phosphor may comprise lanthanum silicon nitride, the second nitride phosphor may comprise β-SiAlON, and the third nitride phosphor may comprise calcium aluminosilicate nitride (CaAlSiN).

In one embodiment, the second nitride phosphor may comprise $Si_{6-z}Al_zN_zO_{8-z}Eu^{2+}$, where $0<z<4.2$.

In one embodiment, a weight proportion of the first nitride phosphor, the second nitride phosphor, and the third nitride phosphor may be 1:1:0.3~0.45.

In one embodiment, a proportion of the third nitride phosphor may be 0.4.

According to one aspect, a phosphor composition may comprise a first phosphor comprising lanthanum silicon nitride, a second phosphor comprising β-SiAlON, and a third phosphor comprising calcium aluminosilicate nitride (CaAlSiN). The phosphor composition may emit a white light having National Television System Committee (NTSC) color saturation greater than 70% in response to excitation by a blue light having a peak wavelength in a range of 450 nm-460 nm.

In one embodiment, the first phosphor may comprise $La_3Si_5N_{11}:Ce^{2+}$.

In one embodiment, a weight proportion of the first phosphor, the second phosphor, and the third phosphor may be 1:1:0.3~0.45.

In one embodiment, a proportion of the third phosphor may be 0.4.

In one embodiment, the second phosphor may comprise $Si_{6-z}Al_zN_zO_{8-z}:Eu^{2+}$, where $0<z<4.2$.

In one embodiment, the third phosphor may comprise $CaAlSiN_3:Eu^{2+}$.

The white light emitting device and the phosphor composition of the present invention are thermally stable and do not have the problems of power saturation and susceptibility to damp. The phosphor composition of the white light emitting device disclosed herein can replace prior art yttrium aluminum garnet phosphor and silicate phosphor, and can be used as a light source of high-quality white light for illumination and display applications.

Detailed description of various embodiments are provided below, with reference to the attached figures, to promote better understanding of the characteristics and benefits of the various embodiments of the present invention.

DETAILED DESCRIPTION OF DISCLOSED EMBODIMENTS

Figure 1:
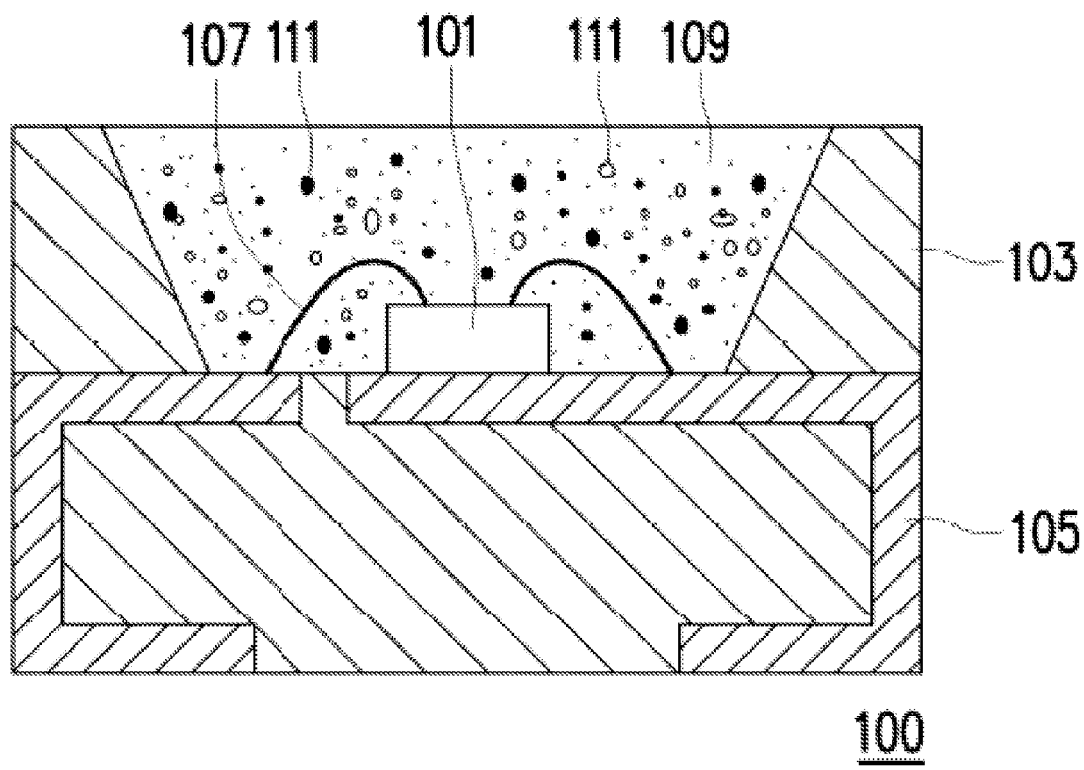
FIG. 1 is a cross-sectional view of a white light emitting device in accordance with an embodiment of the preset invention.

FIG. 1 illustrates a cross-sectional view of a white light emitting device in accordance with an embodiment of the preset invention. Referring to FIG. 1, a white light emitting device 100 comprises a blue LED 101, a reflection shell 103 and an electrically conductive leadframe 105. The blue LED 101 is disposed inside the reflection shell 103 and is electrically connected to the leadframe 105 via wires 107. An encapsulant layer 109 is filled inside the reflection shell 103 and covers the blue LED 101. A phosphor composition 111 is mixed in the encapsulant layer 109 and disposed over the blue LED 101. The phosphor composition 111 comprises a first yellow phosphor, a second yellow phosphor and a red phosphor that convert a portion of a blue light emitted by the blue LED 101 with relatively shorter wavelength into a visible light with relative longer wavelength, which is subsequently mixed with the remainder of the blue light to produce a white light.

In the above-described white light emitting device 100, in order to produce white light having good chromaticity coordinates, the first yellow phosphor, the second yellow phosphor and the red phosphor of the phosphor composition 111 are mixed in an appropriate proportion. The range of emission wavelength of the phosphor composition 111 is between 480 nm and 730 nm, including a yellow light with a peak wavelength of about 540 nm, a yellow light with a peak wavelength of about 550 nm and a red light with a peak wavelength of about 650 nm. The range of emission wavelength of the blue LED 101 is between 410 nm and 480 nm, and the peak wavelength thereof is about 450 nm-460 nm.

In the above-described phosphor composition 111, the first yellow phosphor comprises cerium-doped lanthanum silicon nitride. Its peak wavelength is about 540±5 nm, with full width at half maximum (FWHM) of about 80-100 nm. The molecular formula is $La_3Si_5N_{11}:Ce^{2+}$, and may be purchased from Mitsubishi Chemical Company (MCC) as model number BY201A. The second yellow phosphor comprises europium-activated β-SiAlON. Its peak wavelength is about 550±5 nm, with FWHM of about 80-100 nm. The molecular formula is $Si_{6-z}Al_zN_zO_{8-z}:Eu^{2+}$, where $0<z<4.2$, and may be purchased from Denka Chemicals as model number GR230LW. The red phosphor comprises europium-activated CaAlSiN. Its peak wavelength is about 650±5 nm, with FWHM of about 80-110 nm. The molecular formula is $CaAlSiN_3:Eu^{2+}$, and may be purchased from Mitsubishi Chemical Company as model number BR101D.

Figure 2:
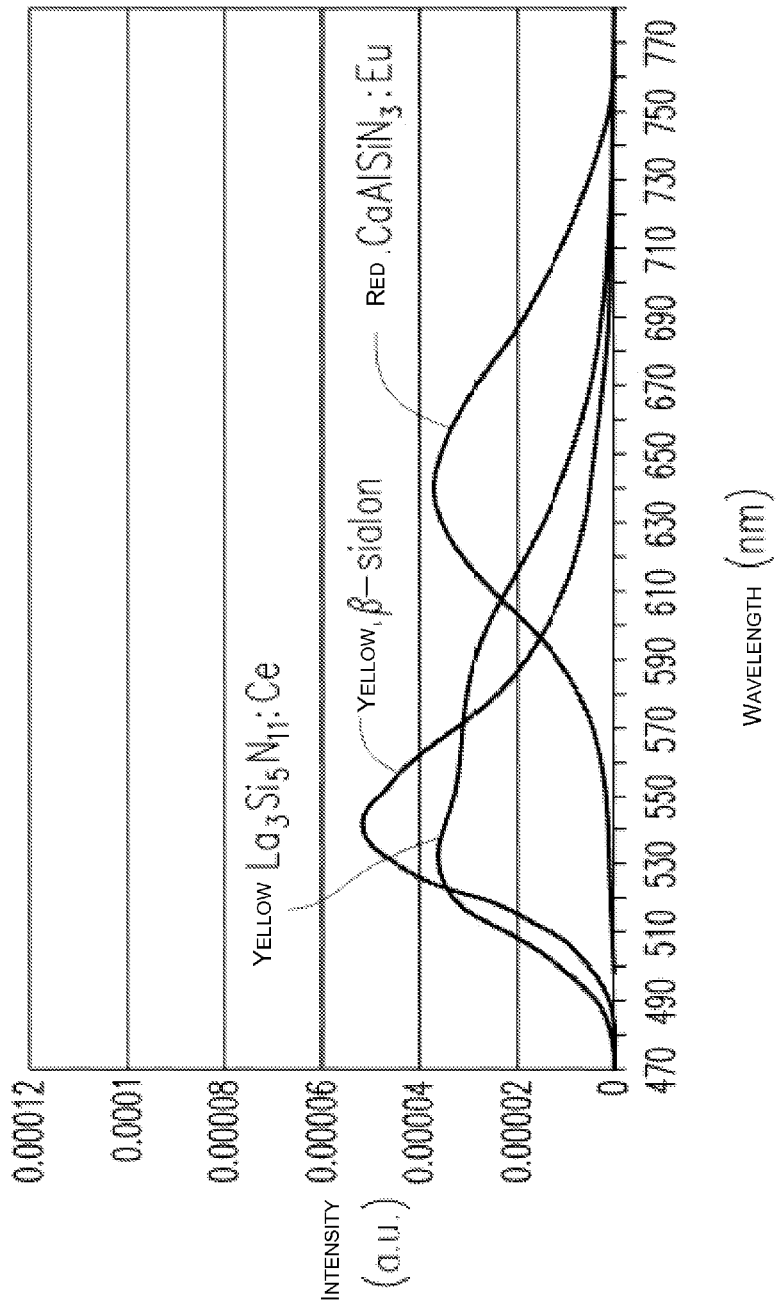
FIG. 2 is a luminescence spectral graph of respective phosphors of a phosphor composition in accordance with an embodiment of the preset invention.

FIG. 2 illustrates a luminescence spectral graph of respective phosphors of the phosphor composition 111 in accordance with an embodiment of the preset invention. Referring to FIG. 2, the first yellow phosphor is $La_3Si_5N_{11}:Ce^{2+}$, which emits a light with a peak wavelength of about 540 nm when excited by a blue light. The second yellow phosphor is $Si_{6-z}Al_zN_zO_{8-z}:Eu^{2+}$, where $0<z<4.2$ (β-SiAlON), which emits a light with a peak wavelength of about 550 nm when excited by a blue light. The red phosphor is $CaAlSiN_3:Eu^{2+}$, which emits a light with a peak wavelength of about 650 nm when excited by a blue light. Referring to FIG. 1, in the white light emitting device 100 of the present invention, the phosphor composition 111 may be formed, by mixing respective phosphors in an appropriate proportion, and then mixed with a translucent sealant to be filled in the reflection shell 103 to form the encapsulant layer 109 to encapsulate the blue LED 101 therein.

Figure 3:
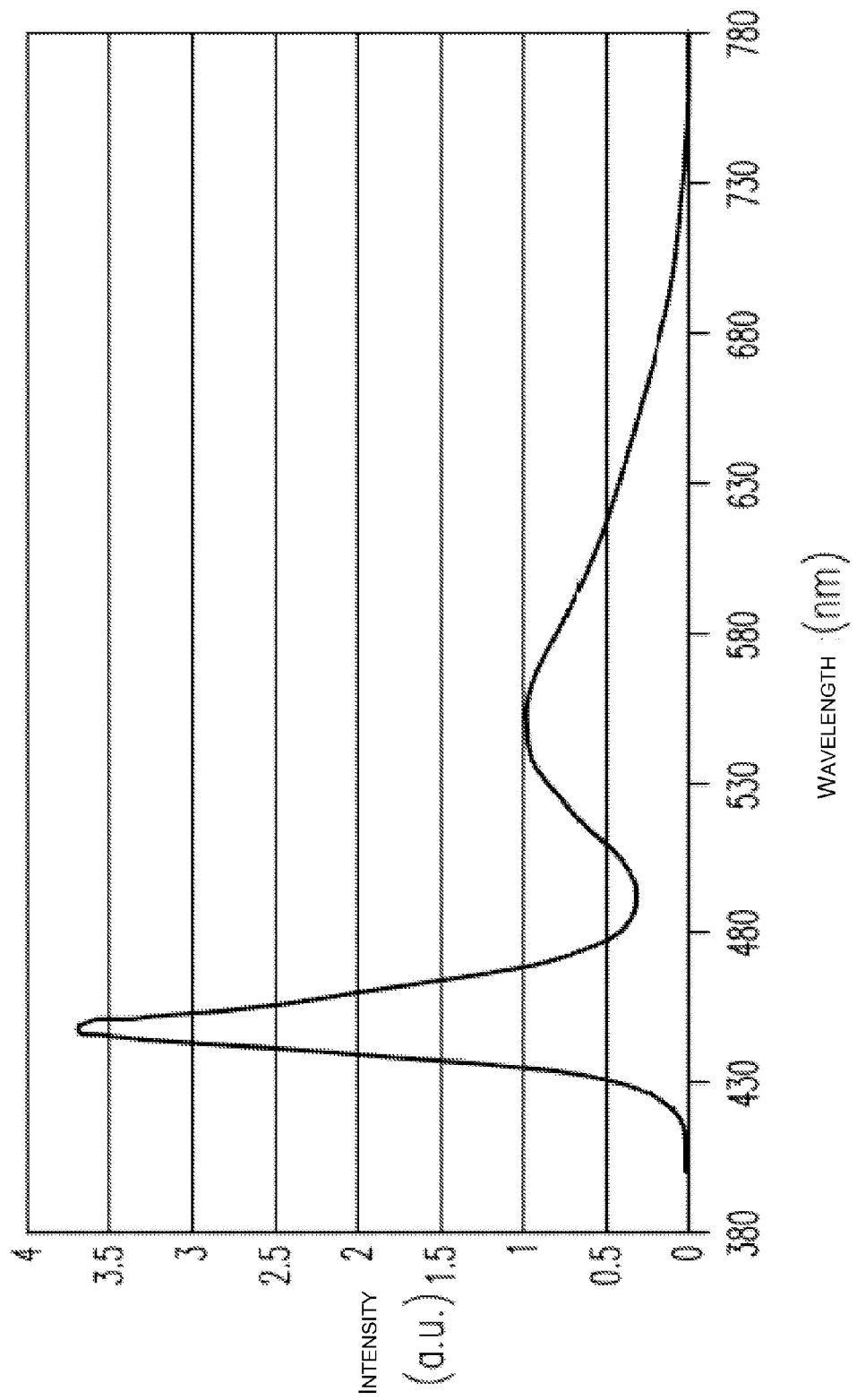
FIG. 3 is a luminescence spectral graph of a white light emitting device in accordance with an embodiment of the preset invention.

Referring to FIG. 3, FIG. 3 illustrates a luminescence spectral graph of a white light emitting device in accordance with an embodiment of the preset invention. As shown in FIG. 2, a phosphor composition is formed by mixing the first yellow phosphor "$La_3Si_5N_{11}:Ce^{2+}$", the second yellow phosphor "$Si_{6-z}Al_zN_zO_{8-z}:Eu^{2+}$, $0<z<4.2$" and the red phosphor "$CaAlSiN_3:Eu^{2+}$" in an appropriate proportion. By disposing such phosphor composition on a blue LED having a peak wavelength of 450-460 nm, a luminescence spectral graph of a white light emitting device in accordance with the present invention may be obtained. The weight proportion of the various phosphors of the phosphor composition is 1:1:0.3~0.45 (w/w, weight proportion). A better proportion of the first yellow phosphor:the second yellow phosphor:the red phosphor=1:1:0.4 (w/w).

As shown in FIG. 3, a white light emitting device in accordance with the present invention has peak wavelengths of about 460 nm and 545 nm, and the entire luminescence spectrum is spread out within a relatively wide range of wavelengths (400 nm-730 nm). The luminescence spectrum achieved by the disclosed embodiments shows the white light thus produced has the characteristic of good chromaticity coordinates, with NTSC greater than 72%, and is suitable for backlight applications in liquid crystal displays such as televisions and dynamic displays. An additional noteworthy point is that, by adding 5-15% (w/w) of a diffuser with particle size $D_{50}$ of 1-10 μm into the above-described phosphor composition, the brightness of the entire white light emitting device may be increased. The diffuser may comprise, for example, $ZnO_2$, $SiO_2$, $TiO_2$, $Al_2O_3$, or any combination of two or more thereof.

Figure 4:
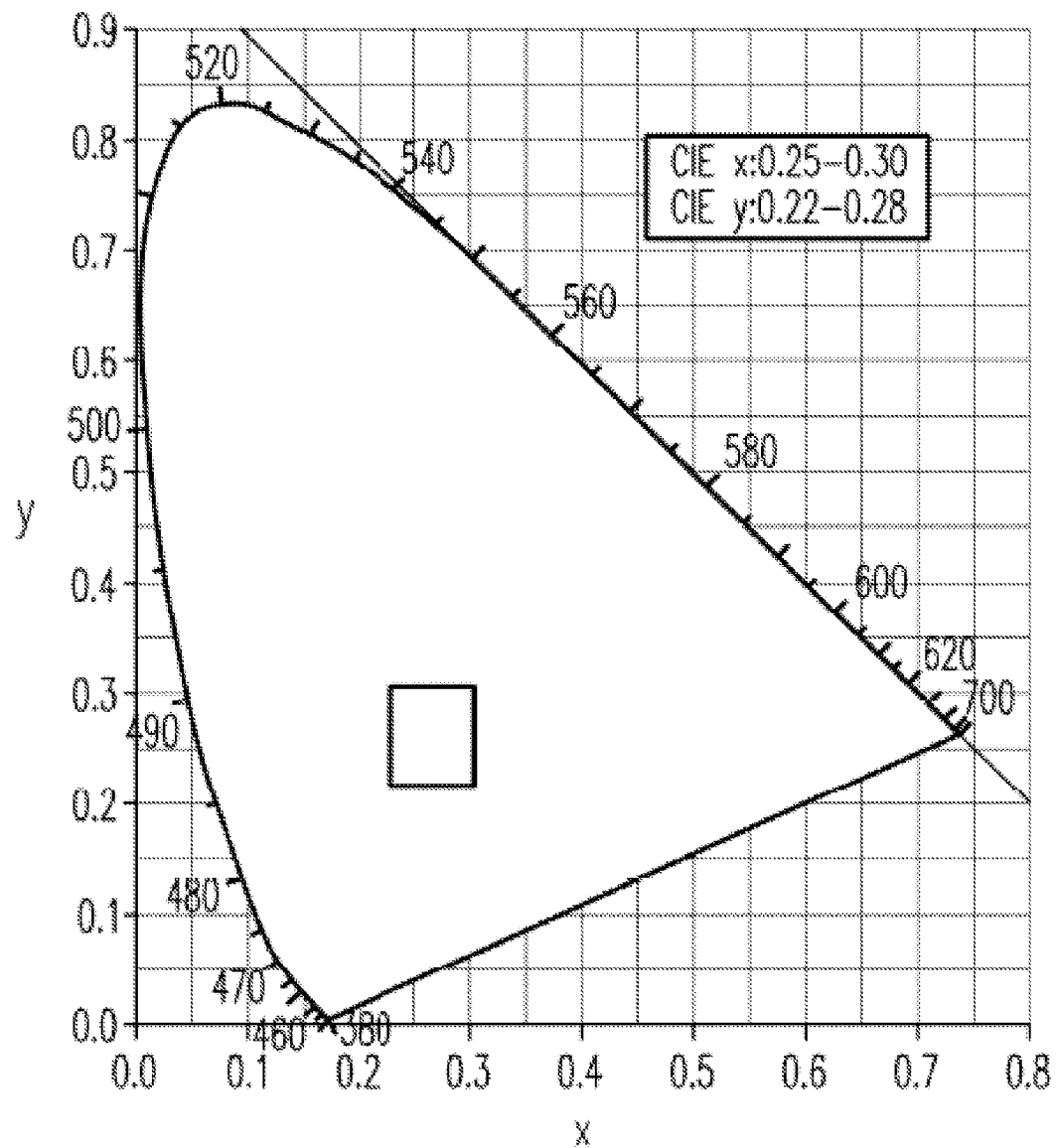
FIG. 4 shows a range in the CIE chromaticity coordinates of a white light emitted by a white light emitting device in accordance with an embodiment of the present invention.

FIG. 4 shows a range in the CIE chromaticity coordinates of a white light emitted by a white light emitting device in accordance with an embodiment of the present invention. Referring to FIG. 4, by adjusting the proportion of mixture of the first yellow phosphor, the second yellow phosphor and the red phosphor in the phosphor composition, a white light in the range of CIE x: 0.25-0.3 and CIE y: 0.22-0.28 may be produced. That is, depending on the need in implementation, the light emission characteristic of the white light emitting device may be adjusted to produce high-quality white light to suit the needs of backlight applications such as televisions and dynamic displays.

Furthermore, the lanthanum silicon nitride phosphor (yellow), the β-SiAlON phosphor (yellow) and the CaAlSiN phosphor (red) in the phosphor composition of the disclosed embodiments are quite stable in reaction to heat, and do not have the issue of brightness decay after being exposed to a high-heat environment due to being at the light source. They are also not susceptible to the problems of breakdown due to damp and power saturation, as with yttrium aluminum garnet phosphor.

It is worth mentioning that, to enhance the excitation efficiency of the phosphor composition 111 by the LED 101, concentration of the phosphor composition 111 may be gradually increased from the surface of the encapsulant layer 109 towards the surface of the LED 101. Alternatively, the LED 101 may be covered by the phosphor composition 111 of a common form, and in such case the phosphor composition 111 of a common form may be formed by spraying, molding, printing, etc. Moreover, it is not necessary to have the LED 101 directly covered by the phosphor composition 111 as the phosphor composition 111 may be excited by the LED 101 by being disposed a distance away from the LED 101. For example, when used in a display or an illumination module, the phosphor composition 111 may be mixed with resin to form a phosphor plate or light guide plate, or may be spread over a resin plate or disposed above a light guide plate. This way, the light uniformity, as well as the thermal tolerance of the phosphor composition 111 with respect to the high heat generated by the LED 101, may be enhanced.

In summary, the phosphor composition used in the white light emitting device of the present invention does not have the problems of thermal instability, susceptibility to damp and power saturation as with conventional phosphors. Additionally, by adjusting the proportion of the various phosphors of the phosphor composition, the spectrum pattern of the white light emitting device may be dynamically adjusted to suit various needs in implementation. Therefore, the phosphor composition of the white light emitting device of the present invention can effectively replace conventional yttrium aluminum garnet phosphor and silicate phosphor to provide better-quality white light as light source of illumination or display applications.

A number of embodiments of the present invention are described herein. However, as those skilled in the art would appreciate, the scope of the present invention is not and cannot be limited to the disclosed embodiments. More specifically, one ordinarily skilled in the art may make various deviations and improvements based on the disclosed embodiments, and such deviations and improvements are still within the scope of the present invention. Accordingly, the scope of protection of a patent issued from the present invention is determined by the claims provided below.

What is claimed is:

1. A white light emitting device that emits a white light, comprising:
   a blue light emitting diode (LED) having an emission wavelength in a range of 440 nm-470 nm; and
   a phosphor composition disposed on the blue LED, the phosphor composition comprising:
     a first nitride phosphor;
     a second nitride phosphor; and
     a third nitride phosphor,
     wherein the first nitride phosphor comprises lanthanum silicon nitride,
     wherein a peak wavelength of the second nitride phosphor is between a peak wavelength of the first nitride phosphor and a peak wavelength of the third nitride phosphor, and
     wherein a range of chromaticity coordinates of the white light is CIE x: 0.25-0.3 and CIE y: 0.22-0.28.

2. The white light emitting device as recited in claim 1, wherein a weight proportion of the first nitride phosphor, the second nitride phosphor, and the third nitride phosphor is 1:1:0.3~0.45.

3. The white light emitting device as recited in claim 1, wherein the phosphor composition further comprises:
   a diffuser comprising $ZnO_2$, $SiO_2$, $TiO_2$, $Al_2O_3$, or any combination of two or more thereof.

4. The white light emitting device as recited in claim 1, wherein the first nitride phosphor comprises $La_3Si_5N_{11}:Ce^{2+}$.

5. The white light emitting device as recited in claim 1, wherein the second nitride phosphor comprises comprises β-SiAlON.

6. The white light emitting device as recited in claim 5, wherein the second nitride phosphor comprises $Si_{6-z}Al_zN_zO_{8-z}:Eu^{2+}$, and wherein $0<z<4.2$.

7. The white light emitting device as recited in claim 1, wherein the third nitride phosphor comprises calcium aluminosilicate nitride (CaAlSiN).

8. The white light emitting device as recited in claim 7, wherein the third nitride phosphor comprises $CaAlSiN_3:Eu^{2+}$.

9. The white light emitting device as recited in claim 1, wherein the blue LED has a peak wavelength in a range of 450 nm-460 nm.

10. A white light emitting device, comprising:
    a blue light emitting diode (LED); and
    a phosphor composition disposed on the blue LED, the phosphor composition comprising a first nitride phosphor, a second nitride phosphor, and a third nitride phosphor,
    wherein a peak wavelength of the second nitride phosphor is between a peak wavelength of the first nitride phosphor and a peak wavelength of the third nitride phosphor, and
    wherein the first nitride phosphor comprises lanthanum silicon nitride, wherein the second nitride phosphor comprises β-SiAlON, and wherein the third nitride phosphor comprises calcium aluminosilicate nitride (CaAlSiN).

11. The white light emitting device as recited in claim 10, wherein the second nitride phosphor comprises $Si_{6-z}Al_zN_zO_{8-z}:Eu^{2+}$, and wherein $0<z<4.2$.

12. The white light emitting device as recited in claim 10, wherein a weight proportion of the first nitride phosphor, the second nitride phosphor, and the third nitride phosphor is 1:1:0.3~0.45.

13. A phosphor composition, comprising:
a first phosphor comprising lanthanum silicon nitride;
a second phosphor comprising β-SiAlON; and
a third phosphor comprising calcium aluminosilicate nitride (CaAlSiN),
wherein the phosphor composition emits a white light having National Television System Committee (NTSC) color saturation greater than 70% in response to excitation by a blue light having a peak wavelength in a range of 450 nm-460 nm.

14. The phosphor composition as recited in claim 13, wherein the first phosphor comprises $La_3Si_5N_{11}:Ce^{2+}$.

15. The phosphor composition as recited in claim 13, wherein a weight proportion of the first phosphor, the second phosphor, and the third phosphor is 1:1:0.3 ~0.45.

16. The phosphor composition as recited in claim 15, wherein a proportion of the third phosphor is 0.4.

17. The phosphor composition as recited in claim 13, wherein the second phosphor comprises $Si_{6-z}Al_zN_zO_{8-z}:Eu^{2+}$, and wherein $0<z<4.2$.

18. The phosphor composition as recited in claim 13, wherein the third phosphor comprises $CaAlSiN_3:Eu^{2+}$.

* * * * *